United States Patent [19]

Kondoh et al.

[11] Patent Number: 5,225,720
[45] Date of Patent: Jul. 6, 1993

[54] SEMICONDUCTOR INTEGRATED CIRCUIT DEVICE

[75] Inventors: Harufusa Kondoh; Hideki Ando, both of Hyogo, Japan

[73] Assignee: Mitsubishi Denki Kabushiki Kaisha, Tokyo, Japan

[21] Appl. No.: 769,438

[22] Filed: Oct. 3, 1991

[30] Foreign Application Priority Data

Oct. 8, 1990 [JP] Japan .................................. 2-270732

[51] Int. Cl.⁵ ..................... H03K 19/173; H03K 17/16
[52] U.S. Cl. ................................. 307/465; 307/465.1; 307/468; 307/443; 307/296.5
[58] Field of Search ..................... 307/465, 465.1, 468, 307/443, 448, 303, 303.1, 303.2, 296.3, 296.5, 296.8, 270, 550, 568

[56] References Cited

U.S. PATENT DOCUMENTS

| | | | |
|---|---|---|---|
| 4,473,762 | 9/1984 | Iwahashi et al. | 307/443 |
| 4,612,497 | 9/1986 | Ulmer | 307/568 |
| 4,752,704 | 6/1988 | Baccarani et al. | 307/568 |
| 4,754,170 | 6/1988 | Toda et al. | 307/568 |
| 4,948,988 | 8/1990 | Kleiss et al. | 307/459 |

Primary Examiner—Edward P. Westin
Assistant Examiner—Andrew Sanders
Attorney, Agent, or Firm—Lowe, Price, LeBlanc & Becker

[57] ABSTRACT

Variable current sources (10a-10c) limit a value of current in each of standard cells (2a-2c) depending on a bias voltage given from a bias voltage generating circuit (11) whereby driving capability of each standard cell is limited. As a result, in both cases where the maximum load capacitance in practice is smaller than the load capacitance assumed at the time of designing, and where each standard cell is operated at a lower operation speed than the speed assumed at the time of designing, waste of power consumption can be avoided and noise can be reduced.

11 Claims, 6 Drawing Sheets

SEMICONDUCTOR INTEGRATED CIRCUIT DEVICE

BACKGROUND OF THE INVENTION

1. Field of the Invention

This invention relates to semiconductor integrated circuit devices, and more particularly, to a semiconductor integrated circuit implementing a desired function by providing a plurality of logic cells on a semiconductor substrate and connecting logic cells to each other.

2. Description of the Background Art

Figure 10:
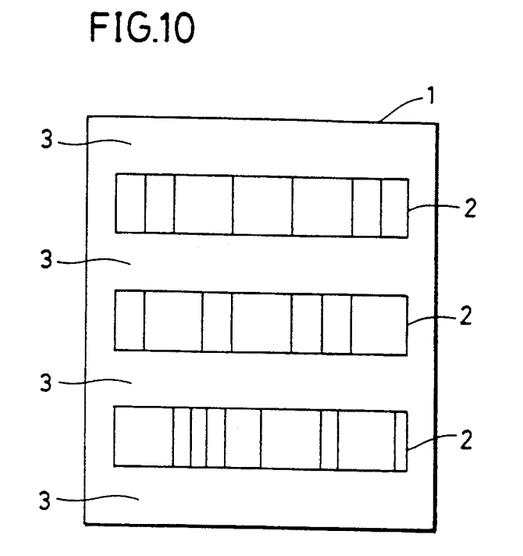
FIG. 10 is a diagram showing one example of a layout of a conventional semiconductor integrated circuit device using standard cells.

FIG. 10 is a diagram illustrating one example of a layout of a conventional semiconductor integrated circuit device employing standard cells. Referring to FIG. 10, standard cell rows 2 and interconnection areas 3 are alternately arranged on a semiconductor substrate 1. Each standard cell row 2 is formed of a plurality of standard cells arranged in a lateral direction. Each standard cell comprises a fundamental logic cell such as a NAND, a NOR, a counter and a latch. Each standard cell is selected so that respective height in a longitudinal direction is the same.

Generally, the above described standard cells are automatically arrayed and interconnected by an automatic design system using CAD (Computer Aided Design). That is, the automatic design system selects the standard cells necessary to perform a desired function from among plural kinds of standard cells previously registered within a data file and arranges them automatically on a semiconductor substrate 1. Subsequently, the automatic design system provides prescribed interconnections for each standard cell arranged regularly on semiconductor substrate 1. As a result, a semiconductor integrated circuit device having desired functions is automatically designed. The aforementioned operation of arranging and interconnecting standard cells is performed according to an automatic arranging and interconnecting program.

As described above, when a semiconductor integrated circuit device is designed by the automatic arranging and interconnecting program, how long the interconnection length of a specific node will be is known only after the automatic arranging and interconnecting is performed, and therefore, each standard cell is designed to have sufficient output driving capability even in the worst case (the case in which an interconnection length becomes the longest). However, in a case where an interconnection length is implemented only with a short interconnection length which does not reach a length in the worst case, as a consequence of the automatic arranging and interconnecting, output driving capability of each standard cell becomes greater than necessary. This is not desirable, because an undesired current flowing in each standard cell (e.g. through current peculiar to CMOS circuits) increases more than necessary and it causes power consumption to be increased. The through current can also be a cause of generating noise on a power supply line in a semiconductor integrated circuit device, and therefore, in an analog-digital mixed integrated circuit device having an analog circuit mounted on the same substrate, an increase in the through current adversely affects circuit operation and circuit property.

The aforementioned problem of an increase in power consumption and noise also arises when a semiconductor integrated circuit designed on the assumption that it is operated at some clock frequency is operated at a frequency lower than the assumed frequency. Additionally, the same problem as the above can also arise in an integrated circuit device using a transistor of a fixed size such as a gate array, and reusing an existing logic cell such as a multiplier and a memory in another integrated circuit.

Figure 11:
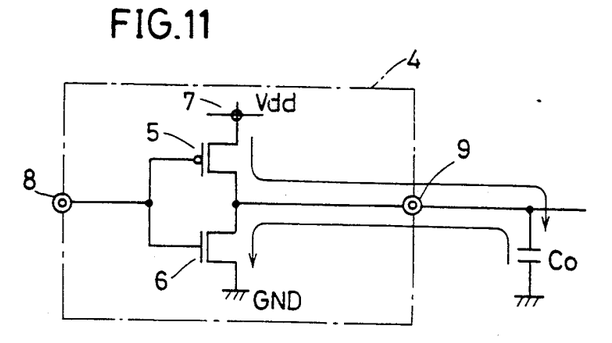
FIG. 11 is a circuit diagram showing one example of a CMOS inverter of a standard cell.

The above described problems will be described more specifically with reference to a CMOS inverter shown in FIG. 1 by way of an example.

A CMOS inverter 4 shown in FIG. 11 is structured by a P channel MOS field effect transistor 5 (a field effect transistor is simply referred to as a transistor hereinafter) and an N channel MOS transistor 6. Connected in series, P channel MOS transistor 5 and N channel MOS transistor 6 are interposed between a power supply 7 (its voltage value is Vdd) and a ground GND. Each gate of P channel MOS transistor 5 and N channel MOS transistor 6 is connected to an input terminal 8. A connecting point of the drain of P channel MOS transistor 5 and the drain of N channel MOS transistor 6 is connected to an output terminal 9. CMOS inverter 4 having such a configuration has a load capacitance Co at its output terminal 9. This load capacitance Co is a sum of an interconnection capacitance and an input capacitance at the next stage.

Figure 12:
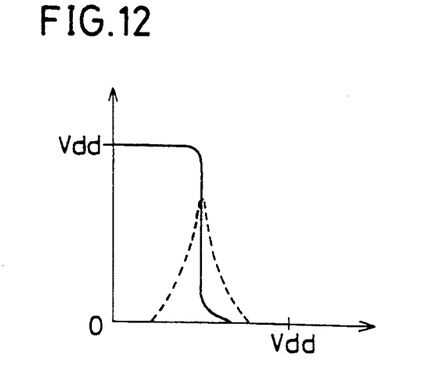
FIG. 12 is a graph showing input/output property of the CMOS inverter shown in FIG. 11.

FIG. 12 is a graph showing an input/output property of the CMOS inverter shown in FIG. 11. The through current of CMOS inverter 4 is shown with broken lines in FIG.12. Because each threshold voltage of P channel MOS transistor 5 and N channel MOS transistor 6 is generally about 1 V when an input voltage is within a range of from 1 V to (Vdd−1) V, P channel MOS transistor 5 and N channel MOS transistor 6 are both turned on and in addition to a current necessary to charge and discharge load capacitance Co, another current flows from power supply 7 to ground GND through a series circuit of P channel MOS transistor 5 and N channel MOS transistor 6. This current is referred to as a through current. A charging current of the load capacitance, a discharging current of the load capacitance and through current are all proportional to the transistor sizes W/L of P channel MOS transistor 5 and N channel MOS transistor 6. W is a channel width of a transistor. L is a channel length of a transistor. As a value of W/L becomes higher, each ON resistance of P channel MOS transistor 5 and N channel MOS transistor 6 becomes smaller, which allows more current to flow.

Therefore, if each of transistors 5 and 6 is designed to have a high value of a transistor size W/L on the assumption that load capacitance Co is that of the worst case, a value of the through current naturally becomes high. However, when load capacitance Co becomes smaller than that of the worst case as a consequence of automatic arranging and interconnecting, the through current becomes undesirably small and wasteful power consumption increases.

When CMOS inverter 4, which is designed to charge and discharge load capacitance Co sufficiently when it is operated with some clock frequency (e.g. 20 MHz), is operated with a clock frequency (e.g. 10 MHz) lower than the frequency determined at the time of designing, each transistor size W/L of each of transistors 5 and 6 is larger than necessary, and therefore through current becomes undesirably too large. Because driving capability of CMOS inverter 4 becomes also greater than necessary, rise/fall of an output waveform of CMOS inverters 4 is sharper than necessary. The sharp change of the output waveform is not desirable because it tends to cause the generation of noise such as ringing and therefore malfunction of the circuit.

As described above, in a conventional semiconductor integrated circuit device, a problem exists that there is a case where driving capability of a logic cell becomes greater than necessary, so that power consumption and noise are increased.

SUMMARY OF THE INVENTION

An object of this invention is, therefore, to provide a semiconductor integrated circuit device which can set driving capability of a logic cell constantly at the optimal value, thereby preventing power consumption and noise from being increased.

A semiconductor integrated circuit device according to this invention performs a prescribed logic function with combined plural logic cells which are coupled to a first reference potential source and to a second reference potential source in order to perform prescribed logic operations. The semiconductor integrated circuit device according to this invention further comprises bias voltage generating means and current value limiting means. The bias voltage generating means generates a bias voltage for setting a current value. The current value limiting means limits a value of current flowing between a first and/or a second reference potential source and a logic cell below the value set by a bias voltage.

According to this invention, current flowing in a logic cell is limited by the current value limiting means below the value set by a bias voltage, whereby driving capability which the logic cell inherently has is limited to the optimal value and power consumption and noise is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
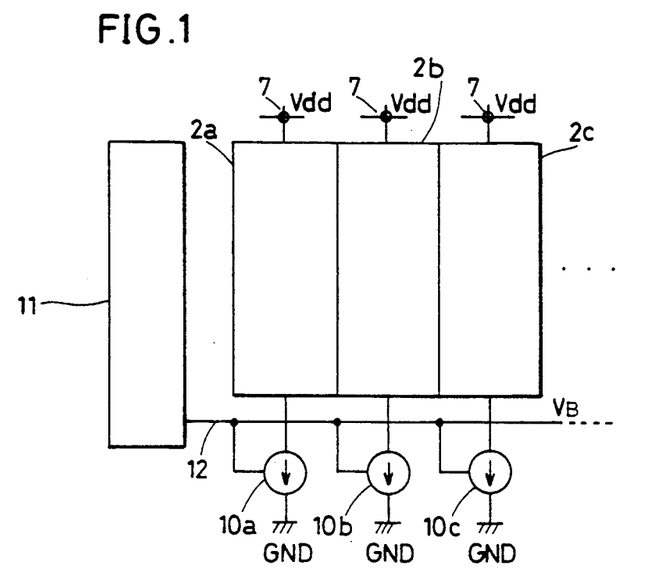
FIG. 1 is a block diagram showing a configuration of one example of this invention.

FIG. 1 is a block diagram showing a configuration of one embodiment of the invention. The embodiment shown in FIG. 1 is of a configuration of a semiconductor integrated circuit device implementing a desired function by arranging standard cells regularly on a semiconductor substrate 1 by means of an automatic arranging and interconnecting program and by providing prescribed interconnections for each standard cell, as the semiconductor integrated circuit device shown in FIG. 10. Standard cells 2a-2c are respectively connected to grounds GND as well as to power supplies 7. Variable current sources 10a, 10b and 10c as current value limiting means are interposed between standard cells 2a, 2b and 2c and grounds GND, respectively. A bias voltage from bias voltage generating circuit 11 is supplied to each of variable current sources 10a-10c through a bias line 12. Each of variable current sources 10a-10c limits a value of current flowing in each of standard cells 2a-2c corresponding to a bias voltage supplied through bias line 12.

Figure 2:
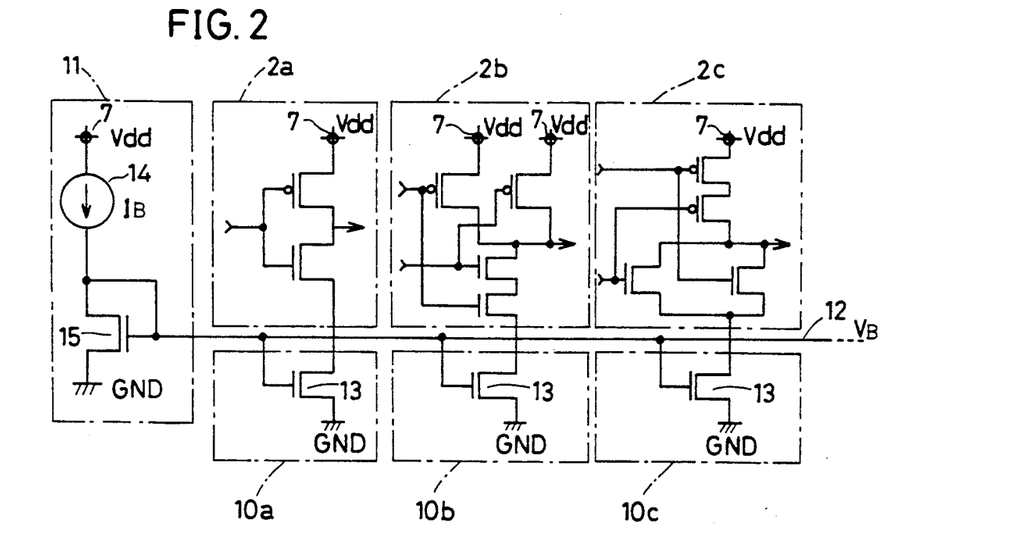
FIG. 2 is a circuit diagram showing one example of a specific configuration of the embodiment shown in FIG. 1.

FIG. 2 is a diagram showing one example of more specific circuit configuration of the embodiment shown in FIG. 1. In a semiconductor integrated circuit device of FIG. 2, a standard cell 2a is structured as a CMOS inverter, a standard cell 2b is structured as a NAND gate and a standard cell 2c is structured as a NOR gate. Since the circuit configurations of the CMOS inverter, the NAND gate and the NOR gate are known in the art, more detailed description of the circuit configurations of standard cells 2a-2c is omitted. Variable current sources 10a-10c each comprise an N channel MOS transistor 13. These N channel MOS transistors 13 have their drains connected to the corresponding standard cells 2a-2c and their sources connected to grounds GND, respectively. The gates of these N channel MOS transistors 13 are connected to a bias line 12. A bias voltage generating circuit 11 comprises a constant current source 14 and an N channel MOS transistor 15. Constant current source 14 is interposed between a power supply 7 and the drain of N channel MOS transistor 15. N channel MOS transistor 15 has its source connected to ground GND. The drain and the gate of N channel MOS transistor 15 are commonly connected, and the common connecting point is connected to bias line 12.

Operation of the embodiment shown in FIGS. 1 and 2 will be described.

The values of a current flowing in N channel MOS transistors 13 forming variable current sources 10a-10c can be controlled by a bias voltage $V_B$ supplied through bias line 12. Bias voltage generating circuit 11 generating bias voltage $V_B$ uses a voltage $V_{GS}$, which is generated between the source and the drain of transistor 15 when a constant current $I_B$ is allowed to flow from a constant current source 14 into transistor 15, as bias voltage $V_B$. As a result, transistor 15 and transistors 13 in variable current sources 10a-10c constitute, what is called, current mirror circuits. Therefore, assuming that the ratio of the size of transistor 15 (W/L) to the size of transistor 13 (W/L) is γ, that is, $$(W/L)_{13}/(W/L)_{15} = \gamma.$$

the value of current in transistors 13 is $\gamma \cdot I_B$.

Figure 3:
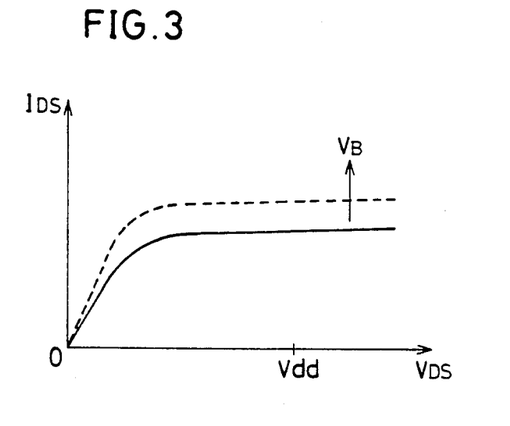
FIG. 3 is a graph for describing operation of the embodiments shown in FIGS. 1 and 2.

FIG. 3 is a graph showing the relationship between a current $I_{DS}$ flowing between the drains and the sources of transistors 13 in FIG. 2, and a drain voltage $V_{DS}$ of transistors 13. This graph in FIG. 3 shows a curve which corresponds to $V_{DS}-I_{DS}$ straight line in a general MOS transistor. Referring to FIG. 3, it can be seen that even though the operating point of transistors 13 shifts from a ground voltage 0 V to a power supply voltage Vdd, current $I_{DS}$ does not exceed a given value. That is to say, the value of current flowing from each of standard cells 2a-2c to ground GND is limited by transistors 13. In other words, each of transistors 13 has a current limiter function. If bias voltage $V_B$ is increased, current $I_{DS}$ increases as shown with a dotted line in FIG. 3. Thus, by changing bias voltage $V_B$, a limit current value in each of variable current sources 10a-10c can be changed.

As described above, variable current sources 10a-10c limit driving capability of each of standard cells 2a-2c by limiting the value of current flowing from standard cells 2a-2c to ground GND. The limited current value in variable current sources 10a-10c varies depending on the value of bias voltage $V_B$. Therefore, the driving capability of each of standard cells 2a-2c can be controlled to have the optimal value by setting bias voltage $V_B$ at an appropriate value, whereby power consumption and noise can be reduced in standard cells 2a-2c. Bias voltage $V_B$ can be set at the optimal value by selecting an appropriate value for supply current quantity $I_B$ in constant current source 14.

Figure 4A:
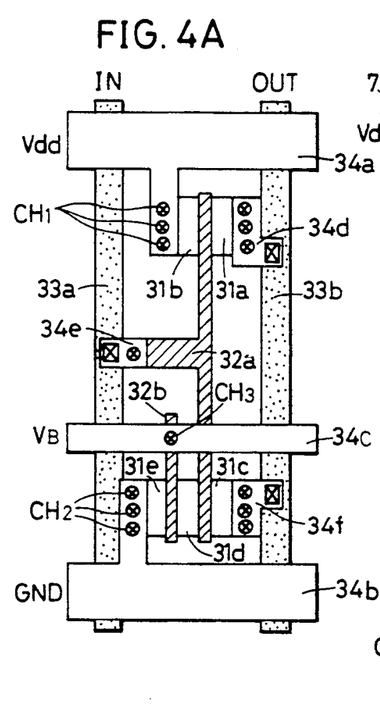
FIG. 4A is a diagram showing one example of a layout in which standard cells and variable current sources are implemented on a semiconductor substrate.
Figure 4B:
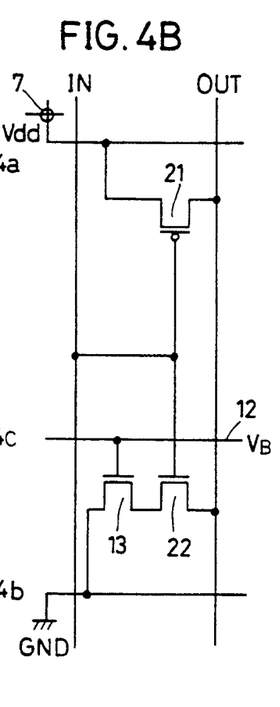
FIGS. 4B and 4C are equivalent circuit diagrams of the integrated circuit shown in FIG. 4A.
Figure 4C:
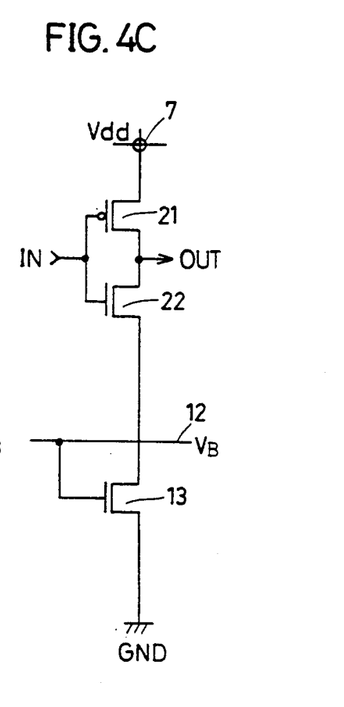

FIG. 4A is a diagram showing one example of a layout of a case in which standard cells and variable current sources shown in FIGS. 1 and 2 are structured on a semiconductor substrate. FIGS. 4B and 4C are equivalent circuits to FIG. 4A. FIG. 4B is an equivalent circuit diagram drawn so that arrangement of transistor devices and interconnections may correspond to the layout of FIG. 4A in two dimensions. FIG. 4C is a revised diagram of the equivalent circuit diagram shown in FIG. 4B in order to show clear correspondence to the embodiment in FIG. 2. FIGS. 4B and 4C depict the same circuit from an electrical point of view.

As can be seen from FIGS. 4B and 4C, a CMOS inverter is employed as a standard cell in a circuit of FIG. 4A. This CMOS inverter is formed of a P channel MOS transistor 21 and an N channel MOS transistor 22. Impurity diffusion layers 31a-31e are provided in predetermined areas on a semiconductor substrate in FIG. 4A. Impurity diffusion layer 31a corresponds to the drain of P channel MOS transistor 21, impurity diffusion layer 31b corresponds to the source of P channel MOS transistor 21, impurity diffusion layer 31c corresponds to the drain of N channel MOS transistor 22, impurity diffusion layer 31d corresponds to the source of N channel MOS transistor 22 and the drain of N channel MOS transistor 13, and impurity diffusion layer 31e corresponds to the source of N channel MOS transistor 13. While one end of a gate polysilicon interconnection layer 32a extends between impurity diffusion layers 31a and 31b, the other end extends between impurity diffusion layers 31c and 31d. Accordingly, one end of gate polysilicon interconnection layer 32a is employed as a gate electrode of P channel MOS transistor 21, and the other end is employed as a gate electrode of N channel MOS transistor 22. One of the end of gate polysilicon interconnection layer 32b extends between impurity diffusion layers 31d and 31e, and therefore a gate electrode of N channel MOS transistor 31 is formed of the end of gate polysilicon interconnection layer 31b. First aluminum interconnection layers 33a and 33b are formed in parallel to each other extending in a longitudinal direction. The first aluminum layer 33a constitutes an input signal line to a CMOS inverter as a standard cell. The first aluminum interconnection layer 33b constitutes an output signal line of the CMOS inverter. Second aluminum interconnection layers 34a-34f are formed on the first aluminum interconnection layers 33a and 33b. The second aluminum interconnection layers 34a-34c are parallel to each other and arranged so as to cross at a right angle with the first aluminum interconnection layers 33a, 33b. Second aluminum interconnection layers 34a constitutes a power supply line and is connected to impurity diffusion layer 31b through a control hole CH1. Second aluminum interconnection layer 34b structures a ground line and is connected to impurity diffusion layer 31e through a contact hole CH2. Second aluminum interconnection layer 34c constitutes a bias line 12 and is connected to gate polysilicon interconnection layer 32b through a contact hole CH3. Second aluminum interconnection layer 34d is provided to connect impurity diffusion layer 31a with first aluminum interconnection layer 33b, second aluminum interconnection layer 34e is provided to connect gate polysilicon interconnection layer 32a with first aluminum interconnection layer 33a, and second aluminum interconnection layer 34f is provided to connect impurity diffusion layer 31c with first aluminum interconnection layer 33b.

Generally, a power supply line (structured by second aluminum interconnection layer 34a) and a ground line (structured by second aluminum interconnection layer 34b) are arranged at the same position in each standard cell and formed in the same width, so that power supply lines and ground lines can be respectively connected only by arranging one standard cell adjacent to another. With reference to a standard cell of FIG. 4A, second aluminum interconnection layer 34c forming bias line 12 is additionally arranged at the same position in each cell and formed in the same width, so that a bias line can be formed in the same interconnection forming process as a power supply line and a ground line, and there is no need to provide an interconnection forming process only for a bias line.

Figure 5:
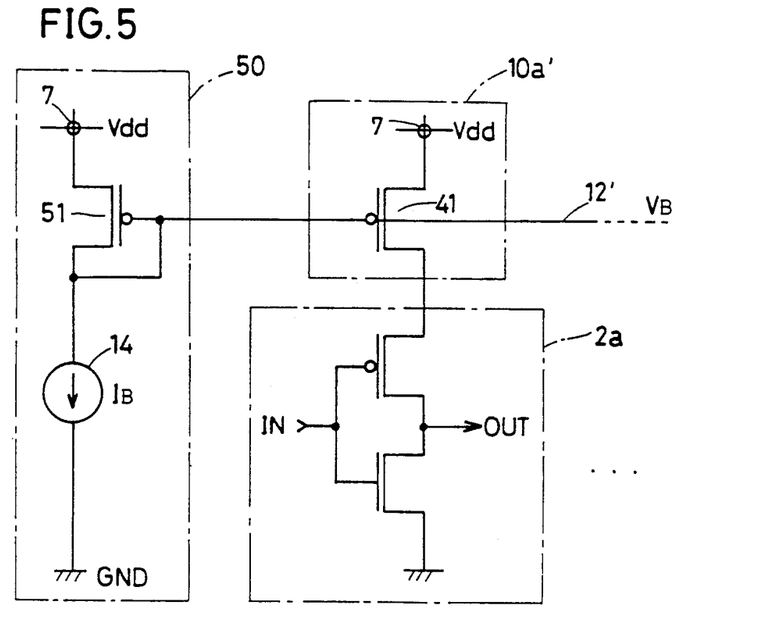
FIG. 5 is a circuit diagram showing a configuration of another embodiment of the invention.

FIG. 5 is a circuit diagram showing a further configuration of this invention. While in the embodiments shown in FIGS. 1 and 2, a variable current source is provided at the ground side of each standard cell, in the embodiment of FIG. 5 a variable current source, is provided at the power supply side of each standard cell. That is, a variable current source 10a' is structured by a P channel MOS transistor 41 interposed between a power supply 7 and a standard cell 2a. The gate of this P channel MOS transistor 41 receives a bias voltage from a bias voltage generating circuit 50 through a bias line 12'. Bias voltage generating circuit 50 is structured by a P channel MOS transistor 51 and a constant current source 14. P channel MOS transistor 51 has its source connected to a power supply 7. Constant current source 14 is interposed between the drain of P channel MOS transistor 51 and a ground GND. The gate and the drain of P channel MOS transistor 51 are commonly connected and the common connecting point is connected to a bias line 12'.

Figure 6:
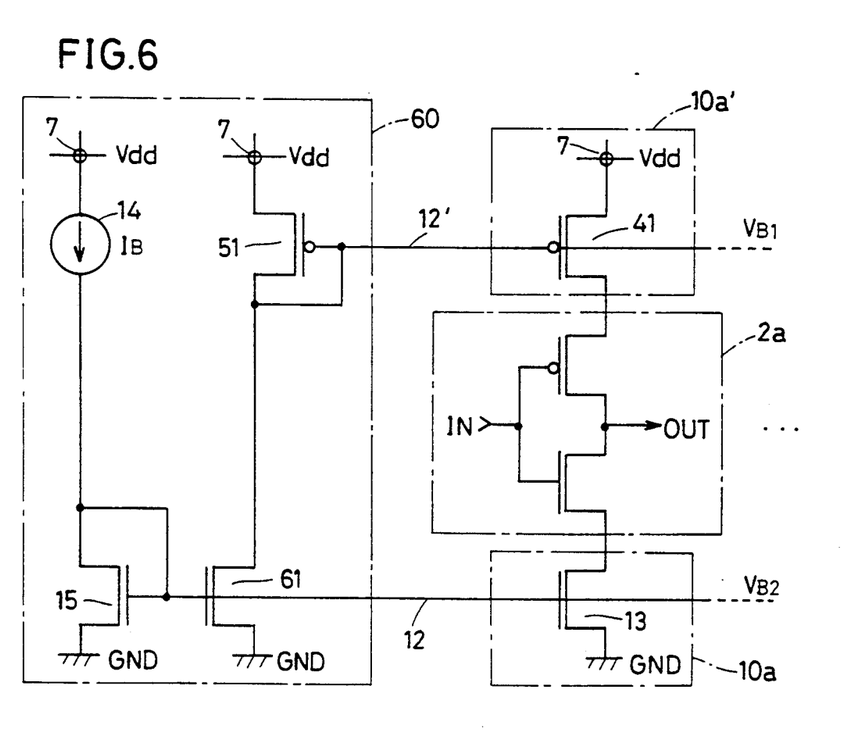
FIG. 6 is a circuit diagram showing a configuration of a further embodiment of the invention.

FIG. 6 is a circuit diagram showing a configuration of a still further embodiment of the invention. In the embodiment of FIG. 6, variable current sources are provided at both the power supply side and the ground side. The gate of a P channel MOS transistor 41 in a variable current source 10a' provided at the power supply side receives a bias voltage $V_{B1}$ from a bias generating circuit 60 through a bias line 12'. The gate of an N channel MOS transistor 13 in a variable current source 10a provided at the ground side receives a bias voltage $V_{B2}$ from bias voltage generating circuit 60 through a bias line 12. Bias voltage generating circuit 60 comprises a constant current source 14, an N channel MOS transistor 15, a P channel MOS transistor 51, and an N channel MOS transistor 61. Constant current source 14 is interposed between power supply 7 and the drain of N channel MOS transistor 15. N channel MOS transistor 15 has its source connected to ground GND. The drain and the gate of N channel MOS transistor 15 are commonly connected, and the common connecting point is connected to bias line 12. The P channel MOS transistor 51 has its source connected to power supply 7 and its drain connected to the drain of N channel MOS transistor 61. The drain and the gate of P channel MOS transistor 51 are commonly connected, and the common connecting point is connected to bias line 12'. N channel MOS transistor 61 has its source connected to ground GND and its gate connected to bias line 12. As in the embodiment of FIG. 6, it is more preferred to provide variable current sources 10a', 10a at both the power supply side and the ground side of each standard cell than to provide a variable current source only at either of the ground side and the power supply side as in the embodiments of FIGS. 2 and 5, in that the driving capability of a standard cell can be controlled more precisely. It is also preferable in that waveforms can be improved both when a standard cell charges a load capacitance and when it discharges a load capacitance.

Figure 7:
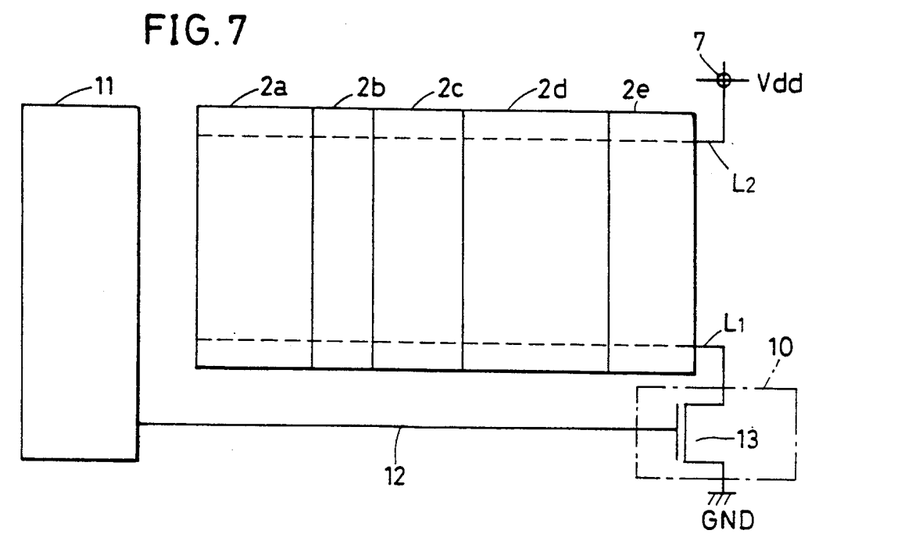
FIG. 7 is a block diagram showing a configuration of a still further embodiment of the invention.

FIG. 7 is a block diagram showing a configuration of a further embodiment of the invention. While in the embodiments of FIGS. 1 and 2, each standard cell is provided with a variable current source, in this embodiment of FIG. 7, one variable current source 10 is provided commonly for a plurality of standard cells 2a-2e arranged adjacently to each other. That is, a variable current source 10 is interposed between a common ground line L1 of standard cells 2a-2e and ground GND. This variable current source 10 is formed of, for example, an N channel MOS transistor 13. N channel MOS transistor 13 has its drain connected to ground line L1, its source connected to ground GND, and its gate connected to a bias line 12. A variable current source may be interposed between a power supply line L2 common to each of standard cells 2a-2e.

As the embodiment shown in FIG. 7, when one variable current source 10 is commonly arranged for a plurality of standard cells, the size of N channel MOS transistor 13 forming variable current source 10 needs to be larger than the size of N channel MOS transistor 13 in FIG. 2. In the embodiment of FIG. 7, if each of standard cells 2a-2e operates simultaneously, the through current can be limited below a prescribed value, but if each standard cell operates separately, a current limiter function does not perform unless the sum of peak values of through current in each of standard cells reaches a limited value determined by the transistor size of N channel MOS transistor 13. As a result, a peak current or a maximum current can be restrained, but the average power is greater than when a variable current source is provided for an individual standard cell. Therefore, the embodiment of FIGS. 1 and 2 wherein a variable current source is provided for each standard cell is preferable to the embodiment of FIG. 7 wherein a common variable current source is provided for a plurality of standard cells, in terms of reduction of power consumption.

Figure 8:
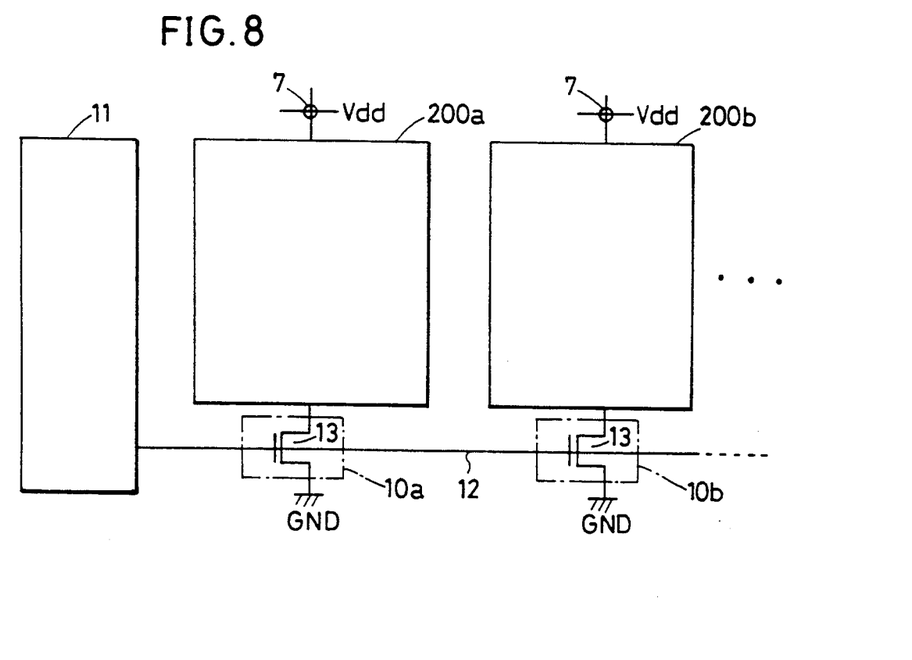
FIG. 8 is a block diagram showing a still further embodiment of the invention.

While this invention is applied to a semiconductor integrated circuit device using standard cells in the embodiments described above, this invention may be applied to a semiconductor integrated circuit device having a developed logic cell, for example, an ALU, a multiplier, a sense amplifier of a memory, an output buffer, etc. In this case, if a developed logic cell is re-used at a lower speed than the speed assumed at the time of development, waste of power consumption can be avoided and noise can be reduced. One example of a configuration of this case is shown in FIG. 8. Referring to FIG. 8, variable current sources 10a, 10b, ... are provided for developed logic cells 200a, 200b, ..., respectively. That is, this embodiment of FIG. 8 is the same as the embodiment shown in FIG. 2 except for developed logic cells with which standard cells in the embodiment shown in FIG. 2 are replaced.

Additionally, in order to limit current in a whole semiconductor integrated circuit, a variable current source may be interposed between a ground line of a semiconductor chip and a ground or between a power supply line and a power supply.

Figure 9:
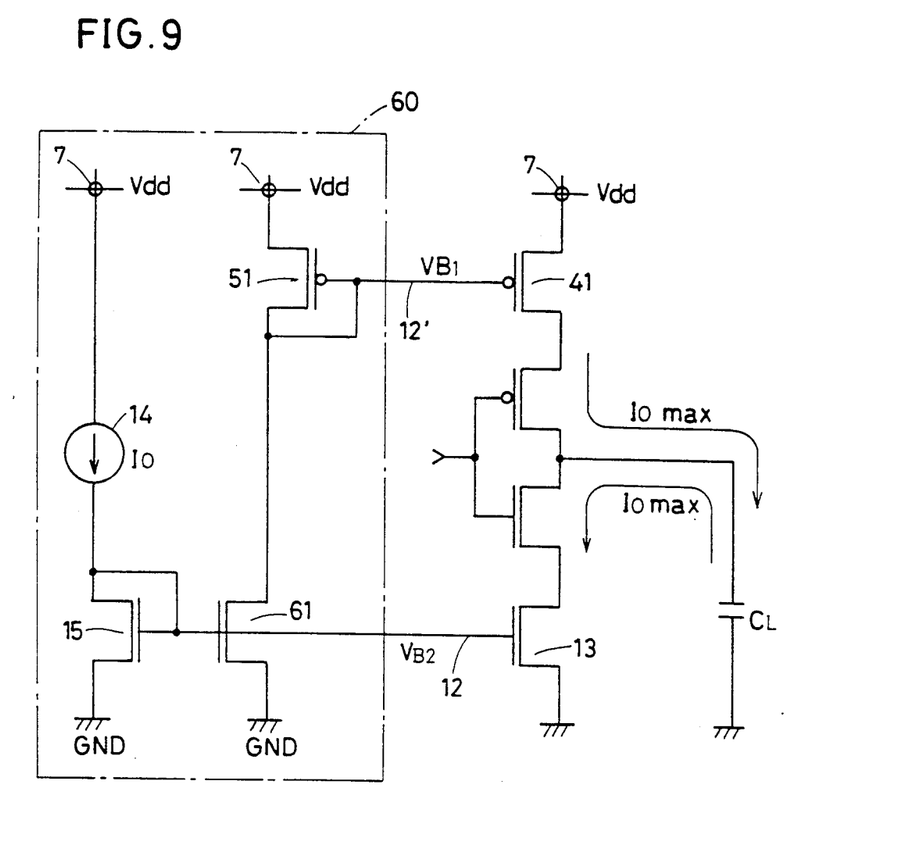
FIG. 9 is a circuit diagram for describing the manner in which the value of current at a constant current source in a bias voltage generating circuit.

The value of constant current flowing in constant current source 14 within a bias voltage generating circuit needs to be adjusted according to a speed used in a semiconductor integrated circuit device. This manner in which the value of constant current is determined would be described with reference to a circuit diagram shown in FIG. 9. A configuration of a circuit shown in FIG. 9 is the same as the circuit configuration of the embodiment shown in FIG. 6.

Assume, for example, that a logic cell designed to be operated with a frequency $f_0$ is operated with a frequency $f_1$. If a current limit value caused by a bias voltage $V_{B0}$ when it is operated with frequency $f_0$ is $I_0$, a rise time Tr of a waveform in charging a load capacitance Cr can be given by the following expression (1)

$$Tr \approx (C_L \cdot Vdd)/I_0 \qquad (1)$$

The above expression (1) can be derived as below.

$$Q = I_0 \cdot Tr$$

$$Q = C_L \cdot Vdd$$

$$\therefore Tr \approx (C_L \cdot Vdd)/I_0$$

(Q represents storage charge of load capacitance $C_L$.)

Because rise time Tr given by the above expression (1) should be shorter than a clock period $1/f_0$, the condition of the following expression (2) should be met.

$$Tr < 1/f_0 \qquad (2)$$

If the number of stages of a logic cell to which a signal must be carried within one period is N (for example, N=5), the condition given by the above expression (2) is the condition presented by the following expression (3).

$$N \cdot Tr < 1/f_0 \qquad (3)$$

In practice, in order to estimate about 20% of design margin, the condition of the above expression (3) needs to be the condition of the following expression (4) by multiplying the left member of the above expression (3) by a margin factor M (M>1: for example, M=1.2)

$$M \cdot N \cdot Tr \lesssim 1/f_0 \qquad (4)$$

Therefore, the following expression (5) and additionally the following conditional expression (6) can be obtained from the above expressions (1), (4), $$M \cdot N \cdot (C_L \cdot Vdd/I_0) \lesssim 1/f_0 \qquad (5)$$

$$\therefore I_0 \gtrsim M \cdot N \cdot C_L \cdot Vdd \cdot f_0 \qquad (6)$$

For reason of simplicity, assuming that $I_0 M \cdot N \cdot C_L \cdot Vdd \cdot f_0$, a limit value $I_1$ in operating a semiconductor integrated circuit device with frequency $f_1$ can be obtained by the following expression (7).

$$I_1 = M \cdot N \cdot C_L \cdot Vdd \cdot f_1 \qquad (7)$$

Therefore, the following expression (8) can be obtained from the above expressions (6) and (7).

$$I_1/I_0 = f_1/f_0 \qquad (8)$$

When a semiconductor integrated circuit is originally designed, the current value $I_0$ of constant current source 14 can be determined based on the above expression (6). If a semiconductor integrated circuit is operated at a frequency lower than the assumed frequency when it was designed, the current value $I_1$ of constant current source can be determined according to the above expression (8).

As described above, according to the invention, in both cases where the maximum load capacitance in practice is smaller than the maximum load capacitance at the time of designing, and where a logic cell is operated at the slower speed than the maximum operation speed assumed at the time of designing, an increase in power consumption can be avoided and noise can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device which performs prescribed logic functions by combining a plurality of logic cells coupled to a first reference potential source and a second reference potential source and performing a prescribed logic operation, comprising:

bias voltage generating means for generating a bias voltage for setting a current limit, said bias voltage generating means including a constant current source for supplying constant current to set said bias voltage, and current value limiting means responsive to said bias voltage generating means for limiting the value of current flowing between said first and second reference potential sources and said logic cells below the limit set by said bias voltage.

2. The semiconductor integrated circuit device according to claim 1, wherein said current value limiting means is provided for each of said logic cells.

3. The semiconductor integrated circuit device according to claim 1, wherein said current value limiting means is commonly provided for two or more of said logic cells.

4. The semiconductor integrated circuit device according to claim 1, wherein said current value limiting means comprises current value limiting devices interposed between said first and/or second reference potential source and said logic cells.

5. The semiconductor integrated circuit device according to claim 4, wherein said current value limiting devices are MOS transistors of which gate receives said bias voltage.

6. The semiconductor integrated circuit device according to claim 1, wherein said logic cells are selected from among standard cells previously registered by automatic arranging and interconnecting program.

7. The semiconductor integrated device according to claim 6, wherein said logic cells are arranged in rows on a semiconductor substrate.

8. The semiconductor integrated circuit device according to claim 7, wherein said logic cells comprises a bias voltage input/output line for inputting/outputting said bias voltage, said bias voltage input/output line is arranged at the same position in each logic cell and has the same width.

9. A semiconductor integrated circuit device which performs prescribed logic functions using at least one logic cell coupled to a first reference potential source and a second reference potential source and performing a prescribed logic operation, comprising:

a current source coupled to the first reference potential source for providing a constant current flow;

a first insulated gate field effect transistor having a first conduction electrode coupled to the second reference potential source, and a second conduction electrode and a gate coupled together to said current source; and at least one second insulated gate field effect transistor connected between said logic cell and the second reference potential source, and arranged in a current mirror fashion with said first transistor for limiting a current flow through said logic cell.

10. The device according to claim 9, wherein said second transistor is responsive to voltage generated between said first and second conduction electrodes of said first transistor.

11. The device according to claim 9, wherein said second transistor has a gate coupled to the gate of said first transistor, a first conduction electrode coupled to the second reference potential source and a second conduction electrode coupled to the logic cell.

* * * * *